(12) United States Patent
Kitamura et al.

(10) Patent No.: US 10,134,673 B2
(45) Date of Patent: Nov. 20, 2018

(54) SEMICONDUCTOR DEVICE AND MANUFACTURING METHOD THEREOF

(71) Applicant: TOSHIBA MEMORY CORPORATION, Minato-ku, Tokyo (JP)

(72) Inventors: Masayuki Kitamura, Mie (JP); Atsuko Sakata, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/449,654

(22) Filed: Mar. 3, 2017

(65) Prior Publication Data

US 2018/0090438 A1    Mar. 29, 2018

(30) Foreign Application Priority Data

Sep. 23, 2016   (JP) .................................. 2016-186045

(51) Int. Cl.
| | | |
|---|---|---|
| *H01L 29/40* | (2006.01) | |
| *H01L 23/528* | (2006.01) | |
| *H01L 23/532* | (2006.01) | |
| *H01L 21/768* | (2006.01) | |

(52) U.S. Cl.
CPC .... *H01L 23/5283* (2013.01); *H01L 21/76804* (2013.01); *H01L 21/76826* (2013.01); *H01L 21/76846* (2013.01); *H01L 21/76879* (2013.01); *H01L 21/76883* (2013.01); *H01L 23/53266* (2013.01); *H01L 23/53295* (2013.01)

(58) Field of Classification Search
CPC ........... H01L 23/5283; H01L 21/76879; H01L 21/76826; H01L 21/76846; H01L 21/76804; H01L 23/53266; H01L 23/53295; H01L 21/76883
USPC ........................................................ 257/751
See application file for complete search history.

(56) References Cited

U.S. PATENT DOCUMENTS

| | | | |
|---|---|---|---|
| 5,393,565 A | 2/1995 | Suzuki et al. | |
| 5,903,053 A | 5/1999 | Iijima et al. | |
| 6,271,573 B1 | 8/2001 | Suguro | |
| 6,271,592 B1* | 8/2001 | Kim ................... | C23C 14/0641 257/751 |
| 6,348,402 B1* | 2/2002 | Kawanoue ........ | H01L 21/76807 257/E21.579 |
| 6,404,058 B1 | 6/2002 | Taguwa | |
| 6,590,251 B2* | 7/2003 | Kang ..................... | C23C 16/34 257/301 |

(Continued)

FOREIGN PATENT DOCUMENTS

| | | |
|---|---|---|
| JP | H11-031669 | 2/1999 |
| JP | 2002-176149 A | 6/2002 |
| JP | 2006-054326 A | 6/2006 |

*Primary Examiner* — Vu A Vu
(74) *Attorney, Agent, or Firm* — Foley & Lardner, LLP

(57) ABSTRACT

According to some embodiments, a semiconductor device includes a substrate and an insulating film that is provided on the substrate. The device further includes a contact plug which includes a barrier metal layer provided in the insulating film, and a plug material layer provided in the insulating film, the barrier metal layer disposed between the plug material layer and the insulating film. The barrier metal layer includes at least a first layer including a first metal element and nitrogen, and a second layer including a second metal element different from the first metal element, and nitrogen.

18 Claims, 11 Drawing Sheets

(56) References Cited

U.S. PATENT DOCUMENTS

| | | | |
|---|---|---|---|
| 7,732,331 B2* | 6/2010 | Kim | H01L 21/28562 |
| | | | 257/754 |
| 7,964,502 B2* | 6/2011 | Dao | H01L 21/76847 |
| | | | 257/621 |
| 8,022,542 B2 | 9/2011 | Saitou | |
| 2005/0148177 A1 | 7/2005 | Murakami et al. | |
| 2009/0098727 A1 | 4/2009 | Hong et al. | |

* cited by examiner

SEMICONDUCTOR DEVICE AND MANUFACTURING METHOD THEREOF

CROSS-REFERENCE TO RELATED APPLICATION

This application claims the benefit of and priority to Japanese Patent Application No. 2016-186045, filed Sep. 23, 2016, the entire contents of which are incorporated herein by reference.

FIELD

Embodiments described herein relate generally to a semiconductor device and a manufacturing method thereof.

BACKGROUND

A barrier metal layer of a contact plug may include a Ti (titanium) layer and a TiN (titanium nitride) layer formed by Chemical Vapor Deposition (CVD). When the TiN layer is heated at a high temperature, there can be a problem that nonbonding nitrogen atoms in the TiN layer diffuse outwardly from the TiN layer. For example, when nitrogen atoms are diffused to a $TiSi_2$ (titanium silicide) layer between a substrate and the Ti layer, the $TiSi_2$ is decomposed by nitrogen, making it difficult to form an ohmic contact. Furthermore, there is also a problem that fluorine atoms generated in forming a tungsten (W) layer functioning as a plug material layer can diffuse to a substrate along a grain boundary in the TiN layer, or that silicon atoms in the substrate can diffuse to the W layer along the grain boundary in the TiN layer. The former diffusion may cause a void in the substrate, and the latter diffusion may cause a conversion of the W layer to a WSi layer. The aforementioned problems may increase contact resistance of the contact plug, such that the yield of a semiconductor device may be lowered.

DETAILED DESCRIPTION

Some example embodiments provide for a semiconductor device capable of preventing an increase in contact resistance of a contact plug and a manufacturing method thereof.

In general, according to some embodiments, a semiconductor device includes a substrate and an insulating film provided on the substrate. The device further includes a contact plug that has a barrier metal layer provided in the insulating film and a plug material layer provided in the insulating film via the barrier metal layer, wherein the barrier metal layer has at least a first layer containing a first metal element and nitrogen and a second layer containing a second metal element different from the first metal element, and nitrogen.

Hereinafter, embodiments of the present disclosure will be described with reference to the drawings.

(First Aspect)

Figure 1:
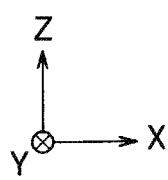
FIG. 1 is a sectional view illustrating some embodiments of a structure of a semiconductor device according to a first aspect.
Figure 1:
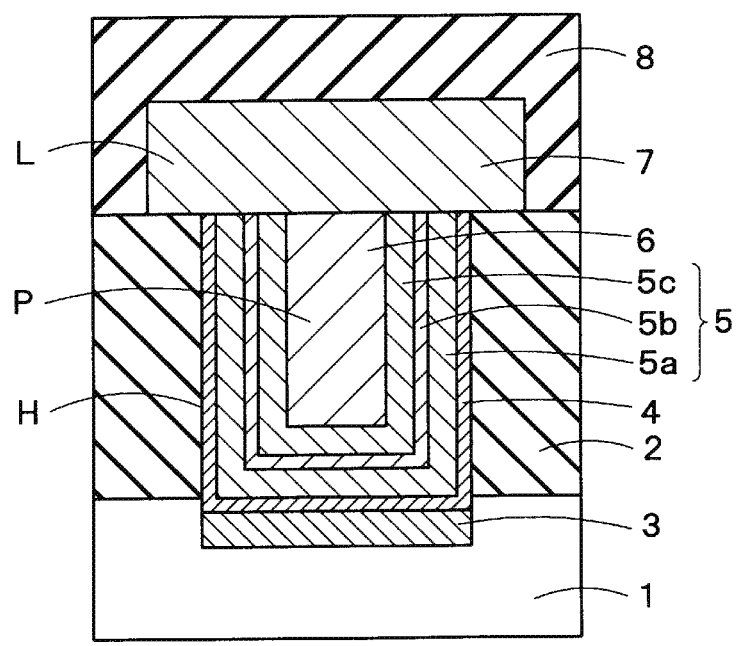

FIG. 1 is a sectional view illustrating some embodiments of a structure of a semiconductor device according to a first aspect.

The semiconductor device of FIG. 1 includes a substrate 1, a first interlayer insulating film 2, a silicide layer 3, a first barrier metal layer 4, a second barrier metal layer 5, a plug material layer 6, an interconnection layer 7, and a second interlayer insulating film 8.

The substrate 1 is, for example, a semiconductor substrate such as a Si (silicon) substrate. FIG. 1 illustrates an X direction and a Y direction forming a plane parallel to an upper surface of the substrate 1 and orthogonal to each other, and a Z direction orthogonal to the upper surface of the substrate 1. In the present description, a +Z direction is referred to as an upward direction and a −Z direction is referred to as a downward direction. The −Z direction may coincide with a direction of gravitational acceleration, or may not, depending on, for example, an orientation of a component or device described herein.

The first interlayer insulating film 2 is formed on the substrate 1 and covers one or more semiconductor elements (not illustrated) such as transistors and capacitors provided on the substrate 1. A contact hole H is formed in and defined at least in part by the first interlayer insulating film 2. In some embodiments, the contact hole H may extend through a part of, and be defined in part by, the substrate 1. The first interlayer insulating film 2 may be, for example, any of a $SiO_2$ film (a silicon oxide film), a SiN film (a silicon nitride film), and a stack of films including at least one of these films.

The silicide layer 3 is formed on the surface of the substrate 1 at a lower part of the contact hole H. The silicide layer 3 is, for example, a $TiSi_2$ layer.

A contact plug P is formed in the contact hole H. The contact plug P includes the first barrier metal layer 4, the second barrier metal layer 5, and the plug material layer 6.

The first and second barrier metal layers 4 and 5 are formed on a bottom of the contact hole H and at a side of the contact hole H. Specifically, the first and second barrier metal layers 4 and 5 are formed on an upper surface of the substrate 1 via the silicide layer 3 (that is, with at least a portion of the silicide layer 3 disposed between the first and second barrier metal layers 4 and 5 and the upper surface of the substrate 1) and are formed on a side surface of the first interlayer insulating film 2. The side surface of the first interlayer insulating film 2 and the portion of the silicide layer 3 disposed between the first and second barrier metal layers 4 and 5 and the upper surface of the substrate 1 may define the hole H. The first barrier metal layer 4 is, for example, a Ti layer. The second barrier metal layer 5 includes a first conductive layer 5a, a second conductive layer 5b, and a third conductive layer 5c, any or all of which are formed on a surface of the first barrier metal layer 4.

The first and third conductive layers 5a and 5c include a first metal element and nitrogen. The first metal element is, for example, titanium, and the first and third conductive layers 5a and 5c are, for example, TiN layers. The first and third conductive layers 5a and 5c are examples of a first layer containing a first metal element.

The second conductive layer 5b includes a second metal element different from the first metal element, and nitrogen. The second metal element is, for example, a metal element having a free energy of nitride formation smaller than that of titanium. The second conductive layer 5b is, for example, a metal nitride film including the second metal element. The second conductive layer 5b is an example of a second layer containing a second metal element.

As will be described in more detail later, some nitrogen atoms in the second conductive layer 5b are diffused nonbonding nitrogen atoms from the first and third conductive layers 5a and 5c. Since the second metal element has a free energy of nitride formation smaller than that of the first metal element, nitrogen atoms diffused from the first and third conductive layers 5a and 5c are readily trapped in the second conductive layer 5b. As a consequence, the second conductive layer 5b holds the nitrogen atoms. Some examples of second metal elements are Tb, Pr, U, Tc, Pu, Ce, Ba, Al, Hf, Li, Sr, Be, La, Nd, Zr, Gd, Sm, Th, Dy, Lu, Ho, Yb, Tm, Er, Sc, Y and the like (these are all element symbols).

The plug material layer 6 is formed in the contact hole H, and specifically, is formed on the substrate 1 in the first interlayer insulating film 2 via the first and second barrier metal layers 4 and 5. The plug material layer 6 is, for example, a W layer.

The interconnection layer 7 is formed on the first interlayer insulating film 2 and the contact plug P, and includes an interconnection L electrically connected to the contact plug P. The interconnection layer 7 is, for example, an Al (aluminum) layer or a Cu (copper) layer.

The second interlayer insulating film 8 is formed on the first interlayer insulating film 2 and covers the interconnection layer 7 provided on the first interlayer insulating film 2. The second interlayer insulating film 8 is, for example, any or all of a $SiO_2$ film, a SiN film, and a stack of films including at least one of these films.

FIG. 2A to FIG. 3B are sectional views illustrating some embodiments of a manufacturing method of the semiconductor device according to the first aspect.

First, the first interlayer insulating film 2 is formed on the substrate 1, the contact hole H is formed in the first interlayer insulating film 2, and the first barrier metal layer 4 is formed over the surface of the substrate 1. As a consequence, the first barrier metal layer 4 is formed along the bottom and the side of the contact hole H (that is, along surfaces of the first interlayer insulating film 2 and the substrate 1 which define the hole H).

Figure 2A:
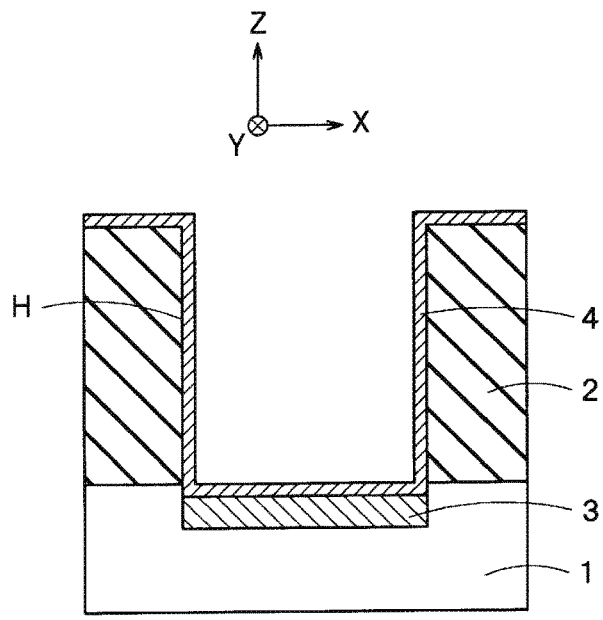
FIGS. 2A and 2B are sectional views illustrating some embodiments of a manufacturing method of a semiconductor device according to the first aspect.

The first barrier metal layer 4, for example, is a Ti layer and is formed using $TiCl_4$ (titanium tetrachloride) gas by a plasma CVD. At this time, silicon in the substrate 1 and titanium in the first barrier metal layer 4 are involved in a silicide reaction caused by heat generated during the plasma CVD, such that the silicide layer 3 ($TiSi_2$ layer) is formed in the substrate 1 (as shown in FIG. 2A). The aforementioned $TiCl_4$ gas may be replaced with another gas including titanium such as dimethylamino titanium (TDMAT) gas, for example.

Figure 2B:
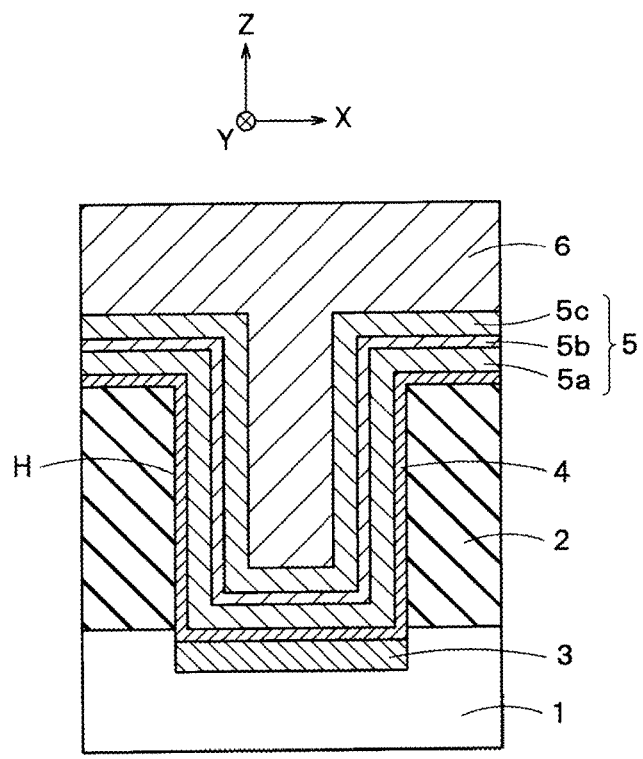

Next, the first conductive layer 5a, the second conductive layer 5b, the third conductive layer 5c, and the plug material layer 6 are sequentially formed over the surface of the substrate 1 (as shown in FIG. 2B). As a consequence, the second barrier metal layer 5 is formed on the bottom and the side of the contact hole H via the first barrier metal layer 4, and the plug material layer 6 is buried in (fills in, at least in part) the contact hole H. The thicknesses of the first to third conductive layers 5a to 5c, for example, are about 2.5 nm, about 1.0 nm, and about 2.5 nm, respectively.

The first and third conductive layers 5a and 5c are, for example, a TiN layer, and are formed by the plasma CVD using $TiCl_4$ gas and gas including nitrogen. The second conductive layer 5b is, for example, a metal film including the second metal element, and is formed by the CVD using gas including the second metal element. In addition, it is noted that the second conductive layer 5b illustrated in FIG. 2B includes little or no nitrogen at the time the CVD process ends. The plug material layer 6, for example, is a W layer and is formed by the CVD using $WF_6$ (tungsten hexafluoride) gas.

Figure 3A:
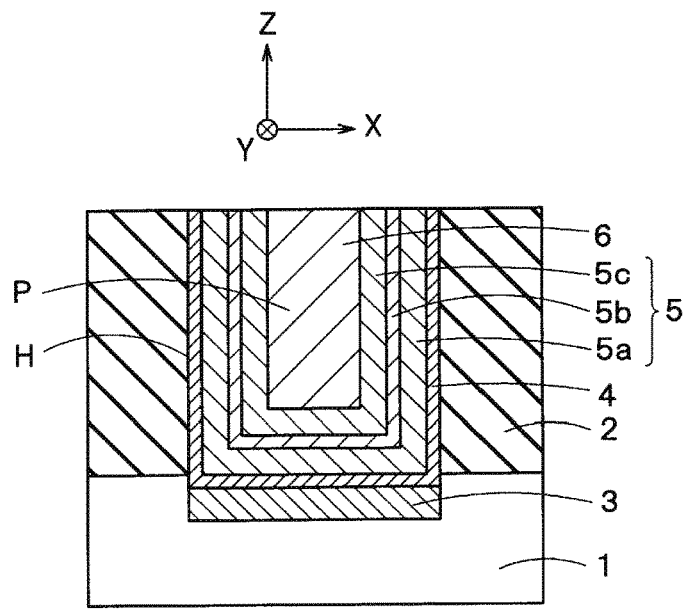
FIGS. 3A and 3B are sectional views illustrating some embodiments of the manufacturing method of a semiconductor device according to the first aspect.

Next, the surface of the substrate 1 is flattened by a Chemical Mechanical Polishing (CMP) process to expose the surface of the first interlayer insulating film 2 (as shown in FIG. 3A). As a consequence, portions of the first barrier metal layer 4, the second barrier metal layer 5, and the plug material layer 6 located outside the contact hole H are removed.

Figure 3B:
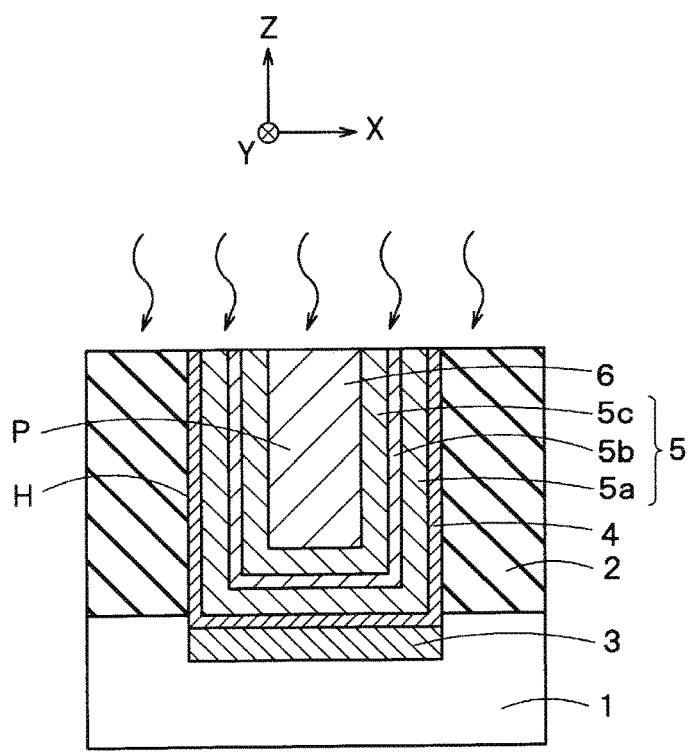

Then, a heating treatment of the substrate 1 is performed, such that the substrate 1, the first interlayer insulating film 2, the silicide layer 3, the first barrier metal layer 4, the second barrier metal layer 5, and the plug material layer 6 are heated (as shown in FIG. 3B). The heating treatment is, for example, a Rapid Thermal Annealing (RTA) process, and the substrate 1 is, for example, heated at about 1000° C. The heating treatment may be performed before the interconnection layer 7 and the second interlayer insulating film 8 are formed, or may be performed after or while the interconnection layer 7 and the second interlayer insulating film 8 are formed.

When the heating treatment is performed, the nonbonding nitrogen atoms of the first and third conductive layers 5a and 5c are diffused outwardly. If the nitrogen atoms are diffused to the silicide layer 3, the $TiSi_2$ of the silicide layer 3 is decomposed into TiN and SiN, such that it impedes formation of an ohmic contact. However, according to some embodiments, the nitrogen atoms can be trapped in the second conductive layer 5b, such that it is possible to prevent the diffusion of the nitrogen atoms to the silicide layer 3. As a consequence, the second conductive layer 5b is changed to a metal nitride film including the second metal element and nitrogen.

Furthermore, the first and third conductive layers 5a and 5c are a TiN layer and are configured with columnar crystals. Thus, in some comparative semiconductor devices, it is probable that fluorine atoms generated from $WF_6$ gas are diffused to the substrate 1 along grain boundaries of the first and third conductive layers 5a and 5c. It is also probable that the silicon atoms in the substrate 1 are diffused to the plug material layer 6 along the grain boundaries of the first and third conductive layers 5a and 5c. However, according to some embodiments (e.g. as shown in FIG. 3B), since the second conductive layer 5b is formed between the first conductive layer 5a and the third conductive layer 5c, a connection between the grain boundaries is blocked by the second conductive layer 5b. Thus, according to some embodiments, it is possible to prevent the diffusion of the fluorine atoms and the silicon atoms via the second conductive layer 5b.

Thus, according to some embodiments, it is possible to prevent the diffusion of the titanium atoms, the fluorine atoms, the silicon atoms, and the like, such that it is possible to prevent an increase in contact resistance of the contact plug P due to the diffusion of these atoms. That is, according to some embodiments, it is possible to provide the contact plug P having low contact resistance.

Next, various interlayer insulating films, the interconnection layer, the plug layer and the like can be formed on the substrate 1. In this way, the semiconductor device illustrated in FIG. 1 is manufactured.

Figure 4A:
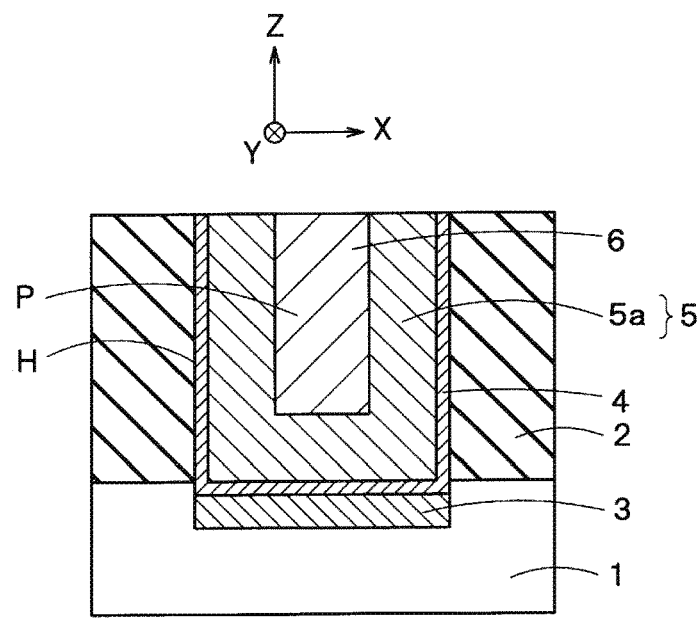
FIGS. 4A and 4B are sectional views illustrating some embodiments of a comparative example of a structure of a semiconductor device.
Figure 4B:
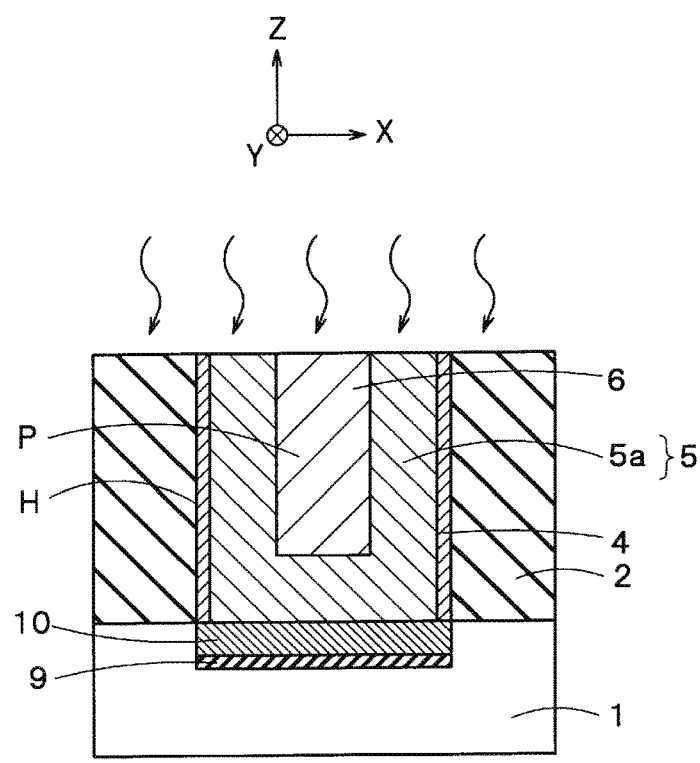

FIGS. 4A and 4B are sectional views illustrating some embodiments of a comparative example of a structure of a semiconductor device.

FIG. 4A illustrates a procedure corresponding to that shown in FIG. 3A. The second barrier metal layer 5 of the comparative example includes the first conductive layer 5a, but does not include the second and third conductive layers 5b and 5c.

FIG. 4B illustrates a procedure corresponding to that shown in FIG. 3B. In the depicted comparative example, when heating treatment is performed, the nonbonding nitrogen atoms in the first conductive layer 5a are diffused to the silicide layer 3, such that the silicide layer 3 is changed to a SiN layer 9 and a TiN layer 10. Moreover, fluorine atoms generated from $WF_6$ gas are diffused to the substrate 1 and silicon atom in the substrate 1 are diffused to the plug material layer 6. As a result, contact resistance of the contact plug P increases. In contrast, according to some embodiments, it is possible to prevent the diffusion of these atoms by the second conductive layer 5b.

Furthermore, the first and third conductive layers 5a and 5c of some embodiments may include a third element having a free energy of nitride formation smaller than that of the first metal element (e.g. titanium), in addition to the first metal element and nitrogen. Such a third element is, for example, silicon. In this way, it is possible to allow the first and third conductive layers 5a and 5c to have a diffusion preventing function for nitrogen atoms and the like, in addition to such a function being performed by the second conductive layer 5b. The silicon atoms in the first and third conductive layers 5a and 5c trap the nitrogen atoms and are changed to SiN, such that it is possible to prevent the diffusion of the nitrogen atoms.

In such embodiments, the first and third conductive layers 5a and 5c may contain a small amount of silicon atoms such that the TiN crystal structure is not substantially broken. The TiN crystal structure can, for example, be detected by X-ray diffraction. For example, silicon atoms may be added to the first and third conductive layers 5a and 5c such that surface separation of a TiN (200) plane measured by the X-ray diffraction and the like is in the range of about 0.20 nm to about 0.22 nm. A value of the surface separation of the TiN (200) plane can be about 0.21 nm.

Furthermore, when the second conductive layer 5b of the present embodiment is formed by a CVD process, the second conductive layer 5b containing a fourth element in addition to the second metal element may be formed. Such a fourth element is, for example, silicon. The silicon can be diffused to the first and third conductive layers 5a and 5c as will be described below.

Figure 5A:
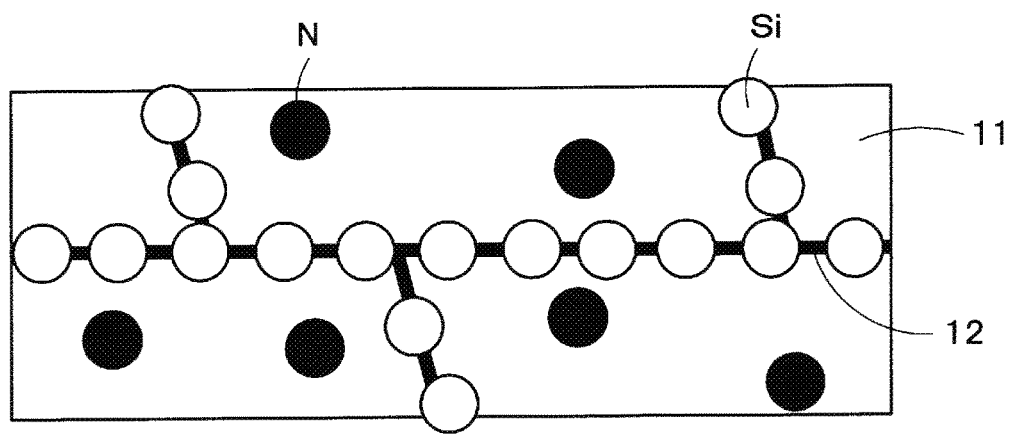
FIGS. 5A and 5B are sectional views for explaining segregation of silicon.
Figure 5B:
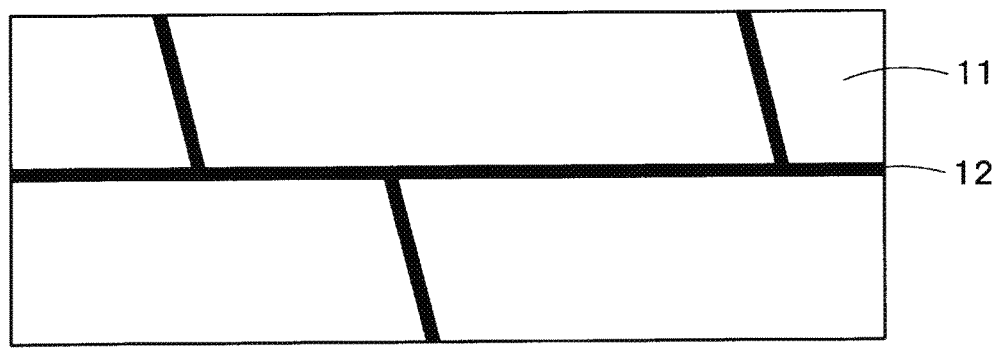

FIGS. 5A and 5B are sectional views for explaining segregation of silicon.

FIG. 5A illustrates examples of sections of the first or third conductive layer 5a or 5c, and illustrates crystal grains 11 in the TiN layer and a boundary 12 between the crystal grains 11. White circles indicate silicon atoms diffused from the second conductive layer 5b. Black circles indicate nonbonding nitrogen atoms of the TiN layer.

In some embodiments, after the second conductive layer 5b containing silicon in addition to the second metal element is formed, silicon atoms are diffused from the second conductive layer 5b to the first and third conductive layers 5a and 5c and are positioned at the boundary 12 between the crystal grains 11. FIG. 5A illustrates silicon atoms positioned at the boundary 12 between the crystal grains 11.

Since the silicon atoms are positioned at the boundary 12, nitrogen atoms have difficulty diffusing through the boundary 12 during heating treatment. Specifically, a diffusion speed of the nitrogen atoms is reduced. A similar effect may be seen in the diffusion of other types of atoms. Furthermore, the silicon atoms at the boundary 12 trap the nonbonding nitrogen atoms and are changed to SiN, such that it is possible to prevent the diffusion of the nitrogen atoms (see FIG. 5B).

Figure 6:
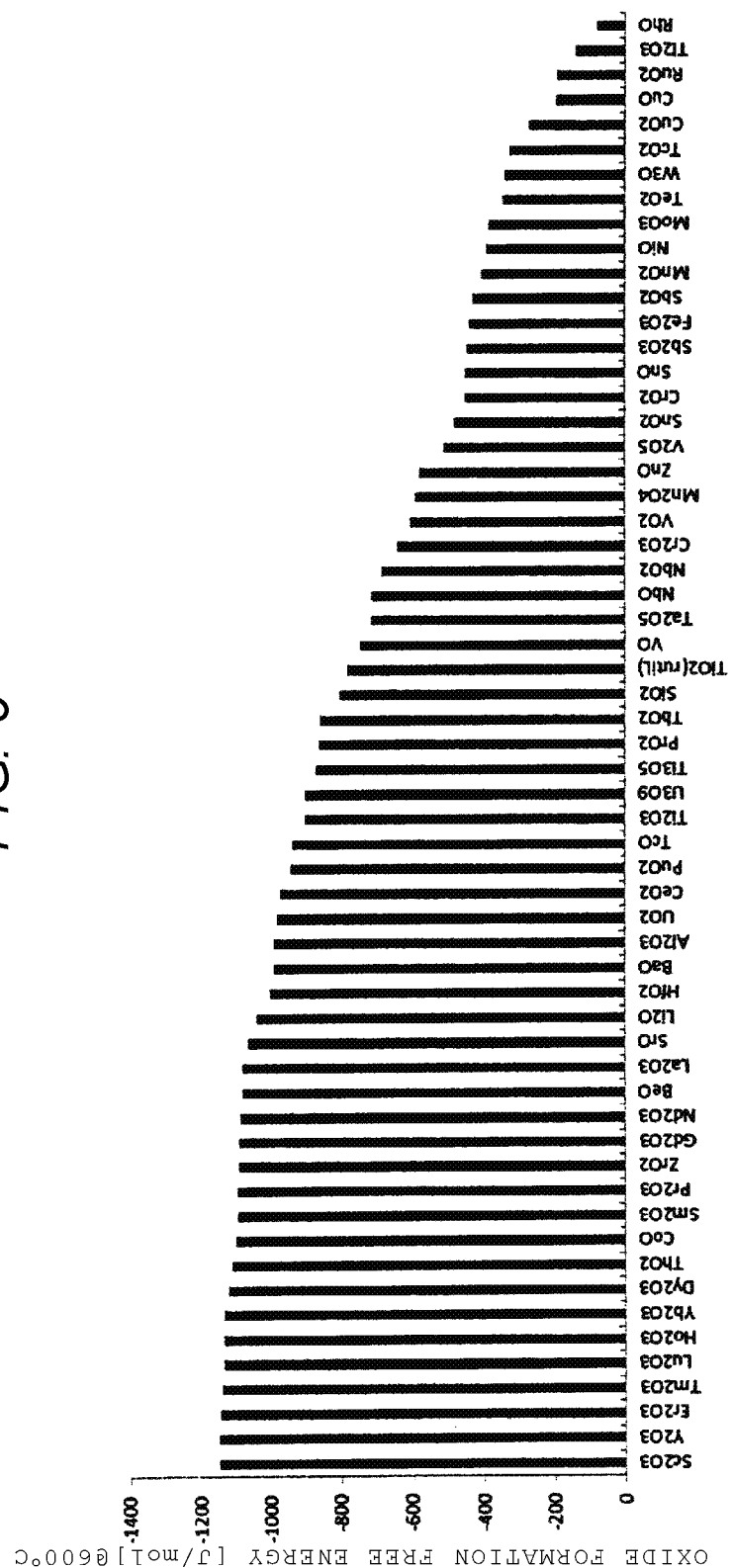
FIG. 6 is a graph illustrating free energy of oxide formation of various elements.

FIG. 6 is a graph illustrating free energy of oxide formation for various elements.

In FIG. 6, a horizontal axis denotes a chemical formula of oxides of various elements, and a vertical axis denotes free energy of oxide formation for the various elements. For example, a value given for $Sc_2O_3$ indicates free energy associated with $Sc_2O_3$ being generated from Sc. As described above, the free energy of oxide formation differs according to the type of an element.

The same applies to the free energy of nitride formation described in some embodiments. For example, the free energy of nitride formation of Ti corresponds to free energy associated with TiN being generated from Ti. The free energy of nitride formation also differs according to the type of an element.

Figure 7:
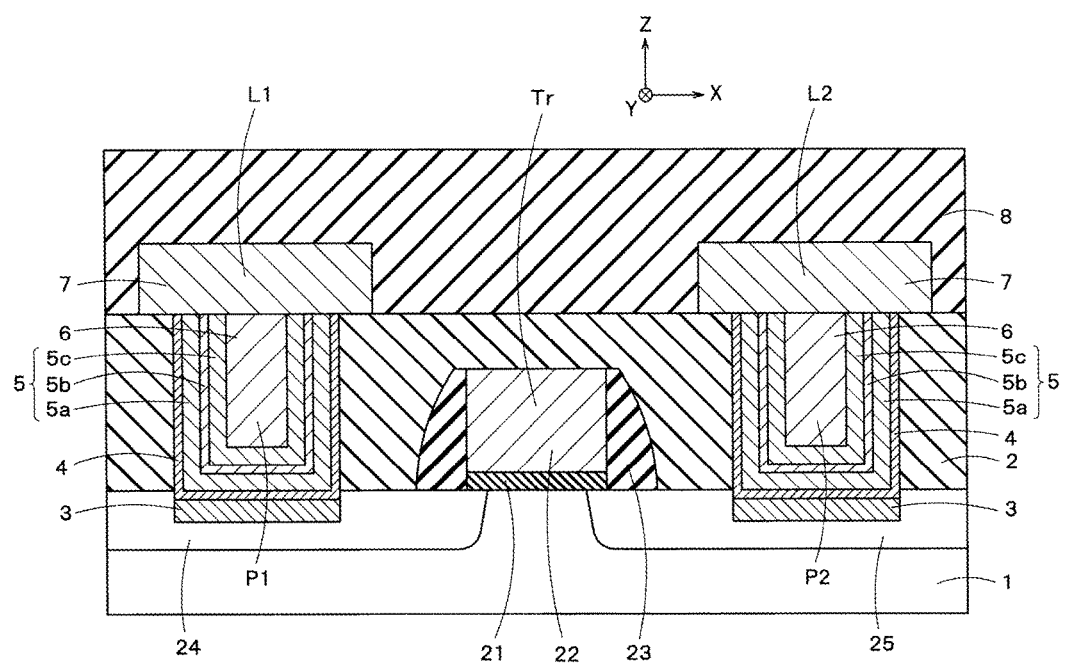
FIG. 7 is a sectional view illustrating some embodiments of a structure of a semiconductor device according to the first aspect.

FIG. 7 is a sectional view illustrating some embodiments of a structure of a semiconductor device according to the first aspect.

FIG. 7 illustrates two contact plugs P1 and P2 and two interconnections L1 and L2, which have structures similar to those illustrated in FIG. 1, and a plane type transistor Tr. The transistor Tr includes a gate insulating film 21 formed on the substrate 1, a gate electrode 22 formed on the gate insulating film 21, and a side wall insulating film 23 formed on a side surface of the gate electrode 22. The gate insulating film 21 is, for example, a $SiO_2$ film or a high-k film (a film with a high dielectric constant). The gate electrode 22 is, for example, a polysilicon layer or a metal layer. The side wall insulating film 23 is, for example, any or all of a $SiO_2$ film, a SiN film, or a stack of films including at least one of these films. The contact plugs P1 and P2 are respectively formed on a source region 24 and a drain region 25, which are provided in the substrate 1 and are disposed such that the transistor Tr id disposed between the source region 24 and the drain region 25.

Figure 8:
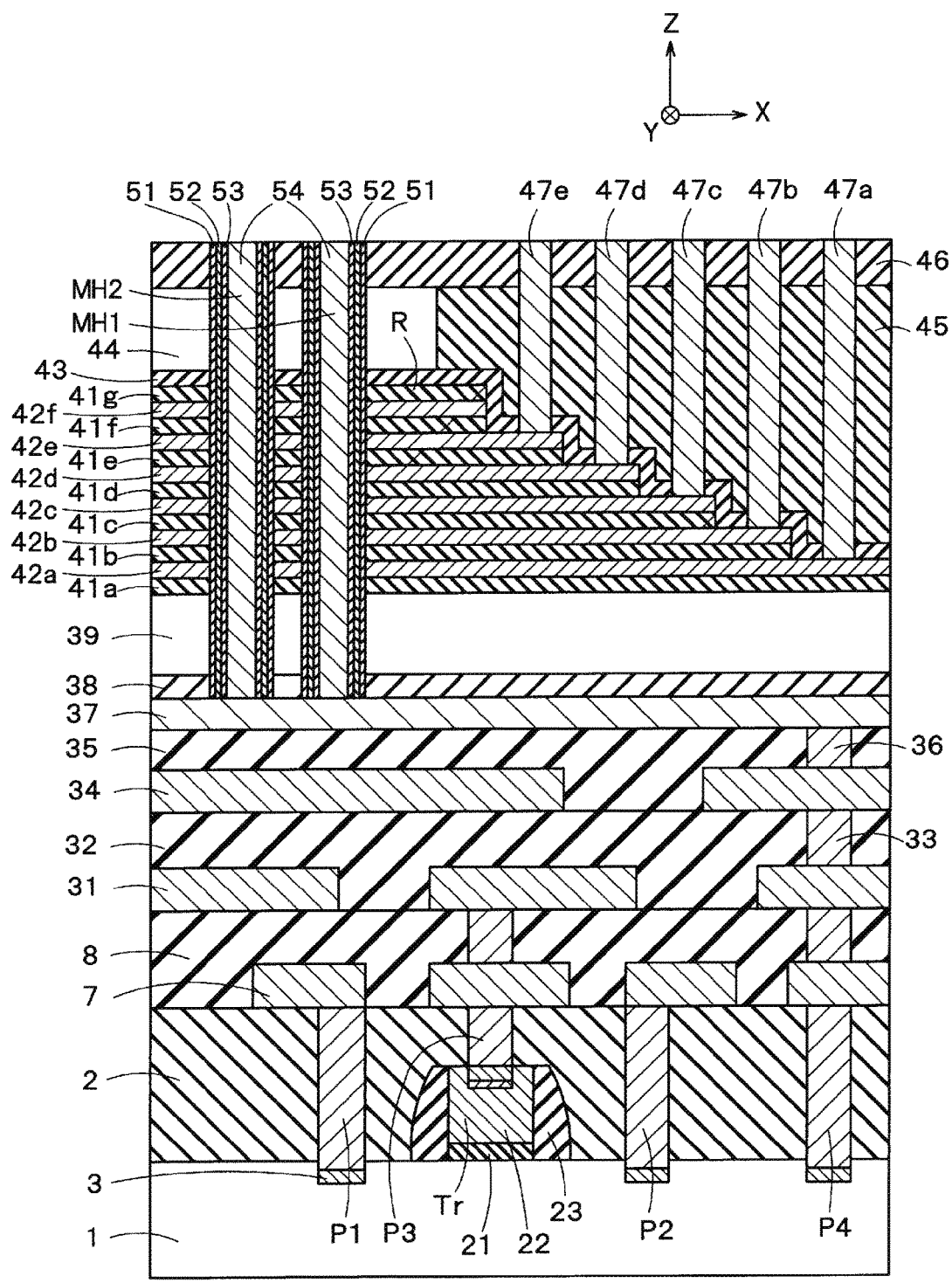
FIG. 8 is a sectional view illustrating some embodiments of a structure of a semiconductor device according to the first aspect.

FIG. 8 is a sectional view illustrating some embodiments of a structure of a semiconductor device according to the first aspect.

FIG. 8 illustrates four contact plugs P1 to P4 having the structure illustrated in FIG. 1. The first barrier metal layer 4, the second barrier metal layer 5, and the plug material layer 6 are not illustrated for convenience. The contact plugs P1, P2 and P4 may be formed on the substrate 1. The contact plug P3 is not formed on the substrate 1, but rather is formed on the gate electrode 22 of the transistor Tr. The structure of the transistor Tr is similar to the transistor Tr illustrated in FIG. 7.

FIG. 8 illustrates a three-dimensional memory device and a structure related to this device. The semiconductor device of FIG. 8 includes an interconnection layer 31, an interlayer insulating film 32, a plug layer 33, an interconnection layer 34, an interlayer insulating film 35, a plug layer 36, an interconnection layer 37, an interlayer insulating film 38, a source-side conductive layer 39, insulating layers 41a to 41g, electrode layers 42a to 42f, an insulating film 43, a drain-side conductive layer 44, an interlayer insulating film 45, an interlayer insulating film 46, contact plugs 47a to 47e, a first memory insulating film 51, a charge storage layer 52, a second memory insulating film 53, and a channel semiconductor layer 54.

The insulating layers 41a to 41g and the electrode layers 42a to 42f are alternately stacked on the substrate 1 via the interlayer insulating films 2, 8, 32, 35, and 38. The interconnection layers 31, 34, and 37 and the plug layers 33 and 36 are covered by the interlayer insulating films 32, 35, and 38. The interlayer insulating film 32 may cover the interconnection layer 31, the interlayer insulating film 35 may cover the interconnection layer 34, and the interlayer insulating film 38 may cover the interconnection layer 37. The plug layer 33 may be embedded in the interlayer insulating film 32, and the plug layer 36 may be embedded in the interlayer insulating film 35. The source-side conductive layer 39 is formed below the electrode layers 42a to 42f, and the drain-side conductive layer 44 is formed above the electrode layers 42a to 42f via the insulating film 43. The electrode layers 42a to 42f serve as control electrodes and word lines of the three-dimensional memory. These are covered by the interlayer insulating films 45 and 46.

A reference numeral R indicates a contact region of the three-dimensional memory. The contact plugs 47a to 47e are formed in the interlayer insulating films 45 and 46, and are electrically connected to the electrode layers 42a to 42e, respectively. In some embodiments, the contact plugs 47a to 47e may have the structure illustrated in FIG. 1.

Reference numerals MH1 and MH2 indicate memory holes provided so as to pass through the insulating layers 41a to 41g and the electrode layers 42a to 42f. The first memory insulating film 51, the charge storage layer 52, the second memory insulating film 53, and the channel semiconductor layer 54 are sequentially formed in the memory holes MH1 and MH2, and may be formed on a side of the hole (e.g. on side surfaces of the insulating layers 41a to 41g and the electrode layers 42a to 42f that define the hole). The channel semiconductor layer 54 is electrically connected to the substrate 1 and to the gate electrode 22 via interconnections in the interconnection layers 8, 31, 34, and 37, via plugs in the plug layers 33 and 36, the contact plugs P1 to P4, and the like.

The structure of the contact plug P illustrated in FIG. 1 can be applied to a semiconductor device which includes various transistors and memories.

As described above, the second barrier metal layer 5 of some embodiments includes the first and third conductive layers 5a and 5c containing the first metal element such as titanium and nitrogen, and the second conductive layer 5b containing the second metal element different from the first metal element, and nitrogen. Thus, according to some embodiments, it is possible to prevent the diffusion of atoms such as titanium atoms, fluorine atoms, and silicon atoms from the second conductive layer 5b, such that it is possible to prevent an increase in the contact resistance of the contact plug P.

(Modification Example of the First Aspect)

In the procedure shown in FIG. 2B, the first and third conductive layers 5a and 5c may be formed by the plasma CVD using $TiCl_4$ gas and gas including nitrogen, and the second conductive layer 5b may be formed by the plasma CVD using $TiCl_4$ gas. In this case, since the first and third conductive layers 5a and 5c become a TiN layer and the second conductive layer 5b becomes a Ti layer after the plasma CVD, all of the first to third conductive layers 5a to 5c become a TiN layer after heating treatment such as the heat treatment shown in FIG. 3B. That is, the second barrier metal layer 5 becomes a layer including only, or mainly, the TiN layer (e.g. a majority of the second barrier metal layer 5, by weight, is composed of TiN). In this case, the first metal element is, for example, titanium, the first gas is, for example, a $TiCl_4$ gas, and the second gas is, for example, a gas including nitrogen. In this way, it is possible to perform the procedures shown in FIGS. 2A to 3B without using the second metal element.

In the procedure shown in FIG. 2B, the first and third conductive layers 5a and 5c may be formed by the plasma CVD using $TiCl_4$ gas and gas including nitrogen, and the second conductive layer 5b may be formed by oxidizing the surface of the first conductive layer 5a. In this case, since the first and third conductive layers 5a and 5c become a TiN layer, and the second conductive layer 5b becomes a $TiO_x$ layer or a $TiNO_x$ layer, the second conductive layer 5b becomes, after the heating treatment such as that shown in FIG. 3B, a $TiNO_x$ layer. In this case, the first metal element is, for example, titanium. In this way, it is possible to perform the procedures of FIGS. 2A to 3B without using the second metal element.

(Second Aspect)

Figure 9:
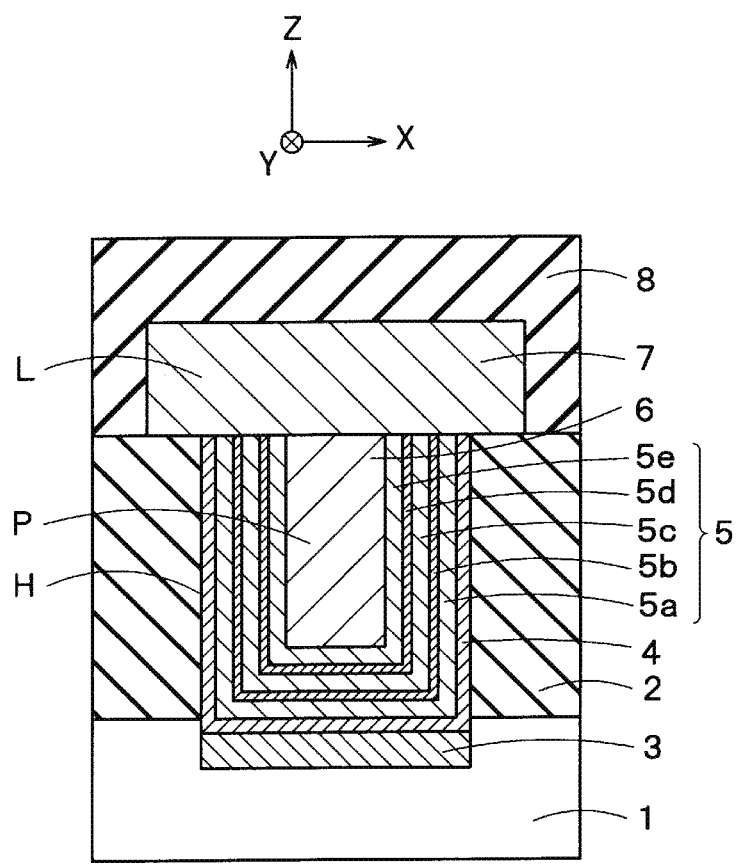
FIG. 9 is a sectional view illustrating some embodiments of a structure of a semiconductor device according to a second aspect.

FIG. 9 is a sectional view illustrating embodiments of a structure of a semiconductor device according to a second embodiment.

The second barrier metal layer 5 of the present embodiment includes the first conductive layer 5a, the second conductive layer 5b, the third conductive layer 5c, a fourth conductive layer 5d, and a fifth conductive layer 5e sequentially formed on the surface of the first barrier metal layer 4.

The first, third, and fifth conductive layers 5a, 5c, and 5e include a first metal element and nitrogen. The second and fourth conductive layers 5b and 5d include a second metal element different from the first metal element, and nitrogen. Examples of the first and the second metal elements are as described above in reference to embodiments according to the first aspect. The first, third, and fifth conductive layers 5a, 5c, and 5e are examples of a first layer containing the first metal element. The second and fourth conductive layers 5b and 5d are examples of a second layer containing the second metal element. The thicknesses of the first to fifth conductive layers 5a to 5e are, for example, about 1.67 nm, about 1.00 nm, about 1.67 nm, about 1.00 nm, and about 1.67 nm, respectively.

The second barrier metal layer 5 may include a plurality of first layers and a plurality of second layers alternately disposed. In this way it is possible to improve an effect that nitrogen atoms and the like are trapped by the second layer and an effect that diffusion of nitrogen atoms and the like are prevented by the second layer.

In some embodiments, the second metal element in a particular second layer and a second metal element in another second layer may be different second metal elements. In this way it is possible to use a plurality of second layers differently, such as by mainly assigning a diffusion preventing function of nitrogen atoms to a particular second layer and mainly assigning a diffusion preventing function of fluorine atoms to another second layer.

The semiconductor device of FIG. 9 can be manufactured by sequentially performing the processes for forming the first to fifth conductive layers 5a to 5e when the second barrier metal layer 5 is formed, in a process similar to the process shown in FIG. 2B. The fourth conductive layer 5d can be formed by a method similar to that used to form the second conductive layer 5b, and the fifth conductive layer 5e can be formed by a method similar to that used to form the first and third conductive layers 5a and 5c.

In some embodiments, at least one of the second and fourth conductive layers 5b and 5d may be formed in the method described in the modification example of the first aspect.

(Third Aspect)

Figure 10:
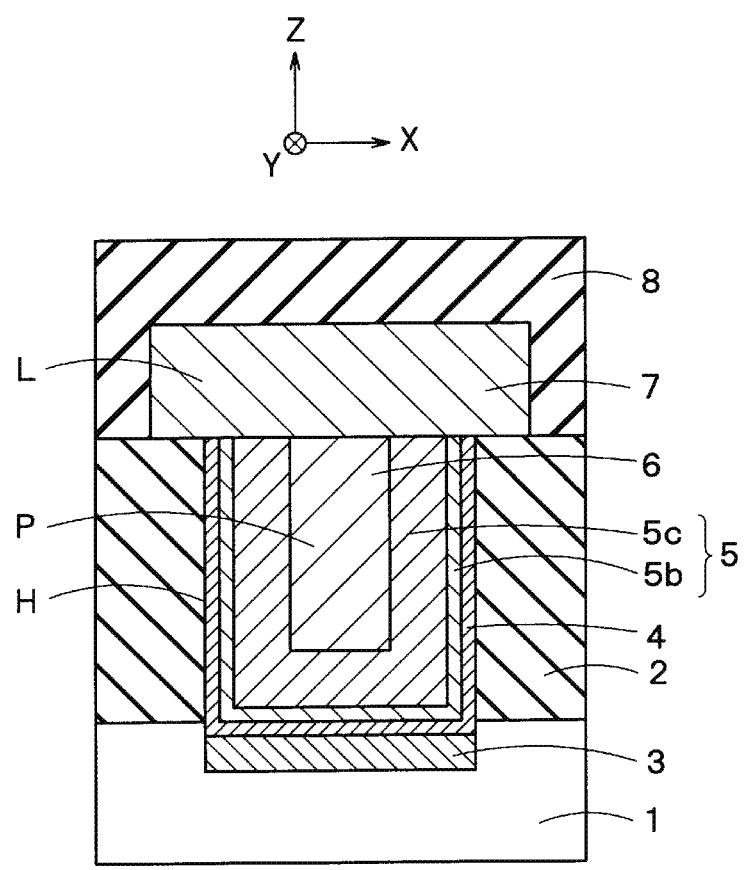
FIG. 10 is a sectional view illustrating some embodiments of a structure of a semiconductor device according to a third aspect.

FIG. 10 is a sectional view illustrating some embodiments of a structure of a semiconductor device according to a third embodiment.

The second barrier metal layer 5 includes the second conductive layer 5b and the third conductive layer 5c sequentially formed on the surface of the first barrier metal layer 4, but does not include the first conductive layer 5a. Such a second barrier metal layer 5 can be formed by omitting the process of forming the first conductive layer 5a from the process shown in FIG. 2B. Such an omission can also be applied to semiconductor devices and/or manufacturing processes according to the second embodiment.

According to some embodiments, the process of forming the first conductive layer 5a is omitted, such that it is possible to reduce the number of manufacturing processes of the semiconductor device while still improving the barrier effect of the second barrier metal layer 5 due to the TiN layer.

(Fourth Aspect)

Figure 11:
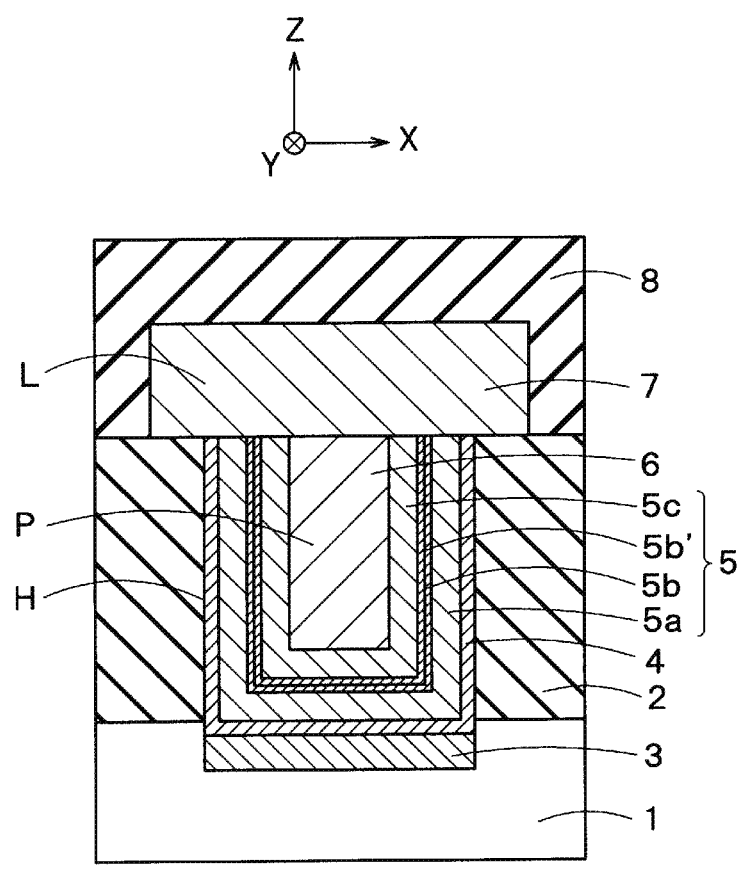
FIG. 11 is a sectional view illustrating some embodiments of a structure of a semiconductor device according to a fourth aspect.

FIG. 11 is a sectional view illustrating some embodiments of a structure of a semiconductor device according to a fourth aspect.

The second barrier metal layer 5 includes the first conductive layer 5a, the second conductive layer 5b, an additional conductive layer 5b', and the third conductive layer 5c sequentially formed on the surface of the first barrier metal layer 4. The second conductive layer 5b is an example of a lower layer of a second layer containing the second metal element, and the additional conductive layer 5b' is an example of an upper layer of the second layer containing the second metal element.

The additional conductive layer 5b' of some embodiments is formed by oxidizing the surface of the second conductive layer 5b in the process shown in FIG. 2B. In this case, the first and third conductive layers 5a and 5c include the first metal element and nitrogen, the second conductive layer 5b includes the second metal element and nitrogen after the heating treatment of FIG. 3B, and the additional conductive layer 5b' includes the second metal element, nitrogen, and oxygen after the heating treatment shown in FIG. 3B. Nitrogen and oxygen in the second conductive layer 5b and the additional conductive layer 5b' come from diffusion and oxidation, respectively.

According to some embodiments, the second layer is configured with the second conductive layer 5b and the additional conductive layer 5b', such that it is possible to improve a diffusion preventing effect for various types of atoms due to the second layer. The oxidation process described here may be applied to the second and fourth conductive layers 5b and 5d of embodiments according to the second aspect.

As used herein, the terms "substantially," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure. Moreover, some or all of the above described embodiments can be combined when implemented.

What is claimed is:

1. A semiconductor device comprising:
   a substrate;
   an insulating film that is provided on the substrate; and
   a contact plug that includes a first barrier metal layer and a second barrier metal layer provided in the insulating film, and a plug material layer provided in the insulating film, the second barrier metal layer disposed between the plug material layer and the first barrier metal layer, and the first barrier metal layer disposed between the second barrier metal layer and the insulating film,
   wherein the first barrier metal layer includes a first metal element, and the second barrier metal layer includes:
   a plurality of first layers including the first metal element and nitrogen, and
   a second layer disposed between the plurality of first layers, the second layer including nitrogen and a second metal element different from the first metal element.

2. The semiconductor device according to claim 1, wherein the first metal element is titanium and the second metal element is a metal element having a free energy of nitride formation smaller than that of titanium.

3. The semiconductor device according to claim 2, wherein at least one first layer of the plurality of first layers further includes a third element having a free energy of nitride formation smaller than that of titanium.

4. The semiconductor device according to claim 3, wherein at least one first layer of the plurality of first layers further includes a fourth element that is positioned along a boundary of crystal grains in the first layer.

5. The semiconductor device according to claim 1, wherein the second barrier metal layer includes a plurality of the second layers disposed in alternating fashion.

6. The semiconductor device according to claim 5, wherein at least one of the second layers includes a lower layer including the second metal element and nitrogen, and an upper layer including the second metal element, nitrogen, and oxygen.

7. The semiconductor device according to claim 1, wherein the second layer includes a lower layer including the second metal element and nitrogen, and an upper layer including the second metal element, nitrogen, and oxygen.

8. A semiconductor device comprising:
a substrate;
an insulating film that is provided on the substrate; and
a contact plug that includes a first barrier metal layer and a second barrier metal layer provided in the insulating film, and a plug material layer provided in the insulating film, the second barrier metal layer disposed between the plug material layer and the first barrier metal layer, and the first barrier metal layer disposed between the second barrier metal layer and the insulating film,
wherein the first barrier metal layer includes a first metal element, and the second barrier metal layer includes:
a first layer including the first metal element and nitrogen, and
a second layer including the first metal element, nitrogen, and oxygen, and
wherein the first layer of the second barrier metal layer is disposed between the first barrier metal layer and the second layer of the second barrier metal layer.

9. The semiconductor device according to claim 8, wherein the second barrier metal layer includes a plurality of the first layers and a plurality of the second layers disposed in alternating fashion.

10. A manufacturing method of a semiconductor device, comprising:
forming an insulating film on a substrate;
forming a contact hole in the insulating film;
forming a first barrier metal layer in the contact hole, the first barrier metal layer including a first metal element;
forming a second barrier metal layer on the first barrier metal layer, the second barrier metal layer including:
a first layer including the first metal element and nitrogen, and
a second layer including the first metal element or a second metal element different from the first metal element;
forming a plug material layer in the contact hole, at least one of the first barrier metal layer and the second barrier metal layer disposed between the plug material layer and the insulating film; and
performing a heating treatment to diffuse nitrogen atoms from the first layer to the second layer.

11. The manufacturing method of the semiconductor device according to claim 10,
wherein the first layer is formed using a first gas including the first metal element and a second gas including nitrogen, and
the second layer is formed using the first gas.

12. The manufacturing method of the semiconductor device according to claim 10, wherein the second layer is formed by oxidizing a surface of the first layer.

13. The manufacturing method of claim 10, wherein the first metal element is titanium and the second metal element is a metal element having a free energy of nitride formation smaller than that of titanium.

14. The manufacturing method of claim 10, wherein the first layer further includes a third element having a free energy of nitride formation smaller than that of titanium.

15. The manufacturing method of claim 14, wherein the first layer further includes a fourth element that is positioned along a boundary of crystal grains in the first layer.

16. The manufacturing method of claim 10, wherein the second barrier metal layer includes a plurality of the first layers, and the second layer is disposed between the plurality of the first layers.

17. The manufacturing method of claim 16, wherein the second layer includes a lower layer including the second metal element and nitrogen, and an upper layer including the second metal element, nitrogen, and oxygen.

18. The manufacturing method of claim 10, wherein the second layer includes a lower layer including the second metal element and nitrogen, and an upper layer including the second metal element, nitrogen, and oxygen.

* * * * *